(12) United States Patent
Lee et al.

(10) Patent No.: US 11,699,618 B2
(45) Date of Patent: Jul. 11, 2023

(54) LOW-K DIELECTRIC DAMAGE PREVENTION

(71) Applicant: TAIWAN SEMICONDUCTOR MANUFACTURING CO., LTD., Hsinchu (TW)

(72) Inventors: Chen-Yi Lee, Hsinchu (TW); Chia-Lin Hsu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/991,665

(22) Filed: Aug. 12, 2020

(65) Prior Publication Data
US 2021/0233809 A1 Jul. 29, 2021

Related U.S. Application Data

(60) Provisional application No. 62/965,552, filed on Jan. 24, 2020.

(51) Int. Cl.
*H01L 21/768* (2006.01)
*H01L 21/02* (2006.01)
*H01L 23/532* (2006.01)

(52) U.S. Cl.
CPC .. *H01L 21/76834* (2013.01); *H01L 21/76832* (2013.01); *H01L 23/53295* (2013.01); *H01L 21/02247* (2013.01); *H01L 21/02252* (2013.01)

(58) Field of Classification Search
None
See application file for complete search history.

(56) References Cited

U.S. PATENT DOCUMENTS

| | | | | |
|---|---|---|---|---|
| 6,335,283 B1 * | 1/2002 | Ngo | ............... | H01L 21/76826 |
| | | | | 257/E21.576 |
| 6,436,808 B1 * | 8/2002 | Ngo | ............... | H01L 21/3105 |
| | | | | 438/623 |
| 6,472,755 B1 * | 10/2002 | Ngo | ............... | H01L 21/76826 |
| | | | | 257/639 |
| 6,491,978 B1 * | 12/2002 | Kalyanam | ......... | H01L 21/76856 |
| | | | | 257/E21.582 |

(Continued)

*Primary Examiner* — Erik Kielin
(74) *Attorney, Agent, or Firm* — Sterne, Kessler, Goldstein & Fox P.L.L.C.

(57) ABSTRACT

The present disclosure describes a method for forming a nitrogen-rich protective layer within a low-k layer of a metallization layer to prevent damage to the low-k layer from subsequent processing operations. The method includes forming, on a substrate, a metallization layer having conductive structures in a low-k dielectric. The method further includes forming a capping layer on the conductive structures, where forming the capping layer includes exposing the metallization layer to a first plasma process to form a nitrogen-rich protective layer below a top surface of the low-k dielectric, releasing a precursor on the metallization layer to cover top surfaces of the conductive structures with precursor molecules, and treating the precursor molecules with a second plasma process to dissociate the precursor molecules and form the capping layer. Additionally, the method includes forming an etch stop layer to cover the capping layer and top surfaces of the low-k dielectric.

20 Claims, 10 Drawing Sheets

(56) References Cited

U.S. PATENT DOCUMENTS

| | | | | |
|---|---|---|---|---|
| 6,528,432 B1* | 3/2003 | Ngo | ............... | H01L 21/31058 |
| | | | | 257/E21.242 |
| 6,635,575 B1* | 10/2003 | Xia | ............... | H01L 21/022 |
| | | | | 257/E21.279 |
| 6,908,847 B2* | 6/2005 | Saito | ............... | H01L 21/76801 |
| | | | | 438/627 |
| 7,648,899 B1* | 1/2010 | Banerji | ............... | H01L 21/76888 |
| | | | | 257/E21.575 |
| 2004/0214446 A1* | 10/2004 | Kim | ............... | H01L 21/02126 |
| | | | | 257/E21.257 |
| 2006/0172552 A1* | 8/2006 | Ajmera | ............... | H01L 21/02362 |
| | | | | 438/778 |
| 2008/0179741 A1* | 7/2008 | Streck | ............... | H01L 21/318 |
| | | | | 257/E23.017 |
| 2009/0269507 A1* | 10/2009 | Yu | ............... | H01L 21/76883 |
| | | | | 427/124 |
| 2015/0228586 A1* | 8/2015 | Usami | ............... | H01L 21/76826 |
| | | | | 257/751 |
| 2019/0157548 A1* | 5/2019 | Wu | ............... | H01L 27/228 |

\* cited by examiner

200

┌─────────────────────────────────────────────┐
│ Form a nitrogen-rich protective layer within a low-k │
│ or ELK layer by exposing the low-k or ELK layer to  │ ~ 210
│ a nitrogen-based plasma process             │
└─────────────────────────────────────────────┘
                        ▼
┌─────────────────────────────────────────────┐
│ Deposit a capping layer on conductive structures │ ~ 220
│ embedded in the low-k or ELK layer          │
└─────────────────────────────────────────────┘
                        ▼
┌─────────────────────────────────────────────┐
│ Form an etch stop layer on the capping layer and the │ ~ 230
│ nitride-rich layer                          │
└─────────────────────────────────────────────┘
                        ▼
┌─────────────────────────────────────────────┐
│ Deposit another low-k or ELK layer on the etch stop │ ~ 240
│ layer                                       │
└─────────────────────────────────────────────┘

FIG. 2

LOW-K DIELECTRIC DAMAGE PREVENTION

CROSS-REFERENCE TO RELATED APPLICATION

This application claims the benefit of U.S. Provisional Patent Application No. 62/965,552, titled "Low-k dielectric capping layers for plasma damage prevention," which was filed on Jan. 24, 2020 and is incorporated herein by reference in its entirety.

BACKGROUND

In an integrated circuit, conductive structures (e.g., metal contacts, vias, and lines) are electrically coupled to transistor regions, such as a gate terminal and source/drain terminals, and are configured to propagate electrical signals from and to the transistors. The conductive structures, depending on the complexity of the integrated circuit, may form one or more layers of metal wiring.

BRIEF DESCRIPTION OF THE DRAWINGS

Aspects of the present disclosure are best understood from the following detailed description when read with the accompanying figures.

FIG. 2 is a flowchart of a method for the formation of a nitrogen-rich protective layer on a low-k or extreme low-k dielectric layer of a metallization layer, in accordance with some embodiments.

DETAILED DESCRIPTION

Figure 1:
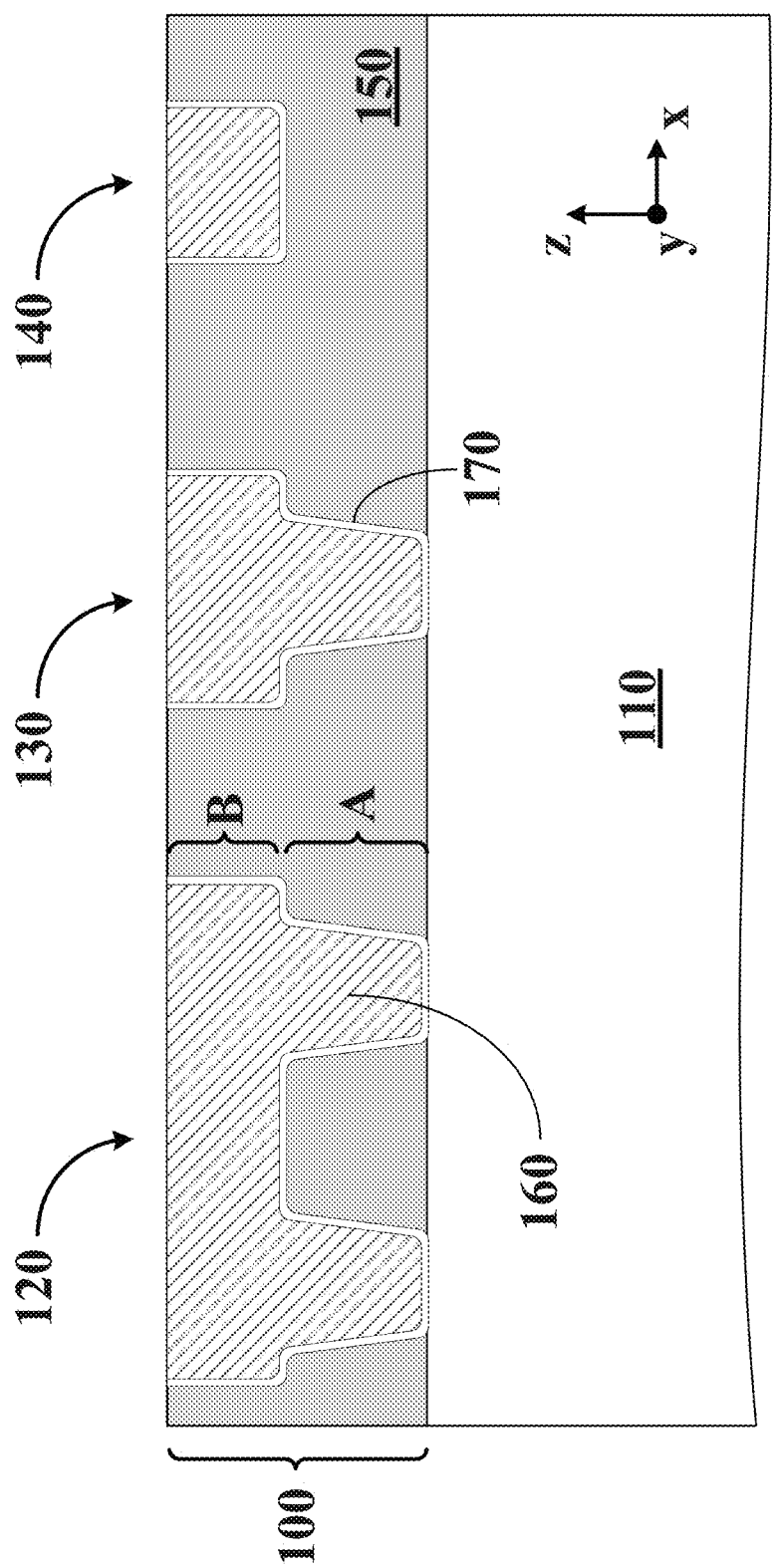
FIG. 1 is a cross-sectional view of a metallization layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may, likewise, be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes and/or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant arts) in light of the teachings herein.

Active and passive devices in integrated circuits (IC) are interconnected through stacks of metallization layers or wiring levels. The metallization layers or wiring levels can be formed in a back-end-of line (BEOL). These metallization layers or wiring levels include conductive structures, such as vias and metal lines, embedded in dielectric materials with a dielectric constant (e.g., a k-value) less than about 3.9—e.g., about 3.2, about 2.8, about 2.4, etc. These dielectric materials are referred to as low-k dielectrics or extra low-k dielectrics (ELK) due to their reduced dielectric constant compared to silicon oxide, whose dielectric constant is about 3.9. The low-k or ELK materials are preferred over silicon oxide because they are able to reduce parasitic capacitances formed between the conductive structures (e.g., the metal wiring) of the metallization layers.

Low-k dielectrics or ELK dielectrics can include carbon-rich silicon oxide films with or without pores having a dielectric constant between about 2.2 and about 3, according to some embodiments. Low-k dielectrics or ELK dielectrics can include a stack of dielectric layers such as a low-k dielectric and another dielectric: (i) a low-k dielectric (e.g.; carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; or (iv) a low-k dielectric (e.g., carbon doped silicon oxide) with silicon oxide. Carbon can be introduced during the growth of the low-k or ELK layer to reduce the dielectric constant of the resulting dielectric film. Pores can also be introduced to further reduce the dielectric constant of the resulting film. Low-k or ELK layers can be deposited with a high-density chemical vapor deposition (HDCVD) process, a plasma-enhanced chemical vapor deposition process (PECVD), a plasma-enhanced atomic layer deposition process (PEALD); or any other suitable deposition process at a thickness range between about 100 nm and about 200 nm depending on the IC design and layout (e.g., the number of wiring levels required, device complexity, wiring density, etc.).

In some embodiments, low-k or ELK layers can be susceptible to damage during subsequent processing operations which can compromise the quality of the low-k or ELK layers and result in electrical failures. These electrical failures can be detected through routine testing, such as time-dependent-dielectric-breakdown (TDDB) testing. For example, a process responsible for the treatment of etch stop layers formed between adjacent metallization layers or wiring levels can damage the low-k or ELK material by creating voids in the low-k or ELK material and by reducing its carbon content.

To address the aforementioned shortcomings, the embodiments described herein are directed to the prevention of low-k or ELK damage from processing operations, such as the ones included in the formation of etch stop layers. In some embodiments, a protective layer is formed on exposed top surfaces of low-k or ELK layers to protect the low-k or ELK material from damage caused, for example, by a plasma treatment process used in the etch stop layer formation. In some embodiments, the protective layer is formed prior to the formation of a capping layer on conductive structures of the metallization layer and prior to the formation of the etch stop layer. In some embodiments, the protective layer is formed during the formation of the capping layer on the conductive structures of the metallization layer and prior to the formation of the etch stop layer. In some embodiments, the low-k or ELK protective layer is a nitrogen-rich layer (e.g., a silicon nitride layer) formed within the top portion of the low-k or ELK layer. In some embodiments, the thickness of the protective layer ranges between about 7 nm and about 15 nm.

According to some embodiments, FIG. 1 is a partial cross-sectional view of a metallization layer or wiring level 100 (thereafter "metallization layer 100") formed on a substrate 110. Metallization layer 100 includes conductive structures 120, 130, and 140 formed within low-k or ELK 150 layer. In some embodiments conductive structures 120, 130, and 140 are filled with copper metal 160 surrounded by a liner stack 170 as shown in FIG. 1. Liner stack 170 can include tantalum and cobalt on which copper metal 160 can be formed by a suitable method for example, electroplating. Conductive structures 120, 130, and 140 can be formed by a dual-damascene process, a single damascene process, or any other suitable metallization process. In the fabrication stage shown in FIG. 1, the top surfaces of conductive structures 120, 130, and 140 are substantially coplanar with a top surface of low-k or ELK 150 layer. FIG. 1 can be a cross-sectional view of metallization layer 100 after a chemical mechanical planarization (CMP) process.

In some embodiments, each of conductive structures 120 and 130 includes a bottom via portion A traversing vertically within metallization layer 100 (e.g., with its longest dimension along the z-direction) and a top line portion B extending laterally (e.g., with its longest dimension along the x- or y'-direction) within metallization layer 100. In some embodiments, conductive structure 140 includes only a line portion B. Conductive structure 140 does not vertically traverse through metallization layer 100 and only extends laterally within metallization layer 100. Conductive structures 120, 130, and 140 are exemplary and not limiting. Therefore, additional conductive structures (e.g., different from conductive structures 120, 130, and 140) having a different configuration, size, or location from conductive structures 120, 130, and 140 are possible. These additional conductive structures are within the spirit and the scope of this disclosure.

Substrate 110 can be a partially fabricated wafer with one or more layers formed thereon. These one or more layers, which are not shown in FIG. 1 for simplicity, can include, for example, frond-end-line (FEOL) structures (e.g., active devices, passive devices, doped regions, epitaxial structures, etc.) and local or global interconnect layers (e.g., middle-of-line (MOL) metallization layers, BEOL metallization layers, or combinations thereof). Metallization layer 100 can be a first BEOL layer of a stack of BEOL metallization layers or any BEOL within a stack of BEOL metallization layers disposed on substrate 110. In some embodiments, metallization layer 100 is electrically coupled to underlying metallization layers (e.g., MOL and/or BEOL metallization layers) or devices within substrate 110. For example, conductive structures 120 and 130 can be in contact with respective conductive structures of underlying metallization layers (e.g., MOL and/or BEOL metallization layers) or devices. The aforementioned layers and features within substrate 110, which are not shown in FIG. 1, are within the spirit and the scope of this disclosure. In some embodiments, FIG. 1 is a precursor structure (e.g., a starting structure) for the embodiments described herein.

FIG. 2 is a flowchart of a fabrication method 200 for the formation of a nitrogen-rich protective layer on low-k or ELK 150 layer of metallization layer 100 shown in FIG. 1. Other fabrication operations can be performed between the various operations of method 200 and are omitted merely for clarity and ease of description. These various operations are within the spirit and the scope of this disclosure. Additionally, not all operations may be required to perform the disclosure provided herein. Some of the operations may be performed concurrently, or in a different order than the ones shown in FIG. 2. In some embodiments, one or more other operations may be performed in addition to or in place of the presently described operations. Method 200 will be described in reference to FIGS. 3-7.

In referring to FIG. 2, method 200 begins with operation 210 and the process of forming a nitrogen-rich protective layer within low-k or ELK 150 layer by exposing low-k or ELK 150 layer to a nitrogen-based plasma process. In some embodiments, the nitrogen-based plasma includes ammonia (NH3) or nitrogen (N2) at a "low-pressure" less than about 4.5 Torr. A pressure less than about 4.5 Torr ensures that a sufficiently thick nitrogen-rich protective layer (e.g., silicon nitride) forms on low-k or ELK 150 layer—e.g., with a thickness between about 7 nm and about 15 nm according to some embodiments. In some embodiments, the low process pressure is combined with a "high" plasma power setting greater than about 350 Watts. In some embodiments, the formation of nitrogen-rich protective layer within low-k or ELK 150 layer includes a process pressure between about 1.5 Torr and about 4.5 Torr and a plasma power setting between about 350 Watts and about 500 Watts.

Figure 3:
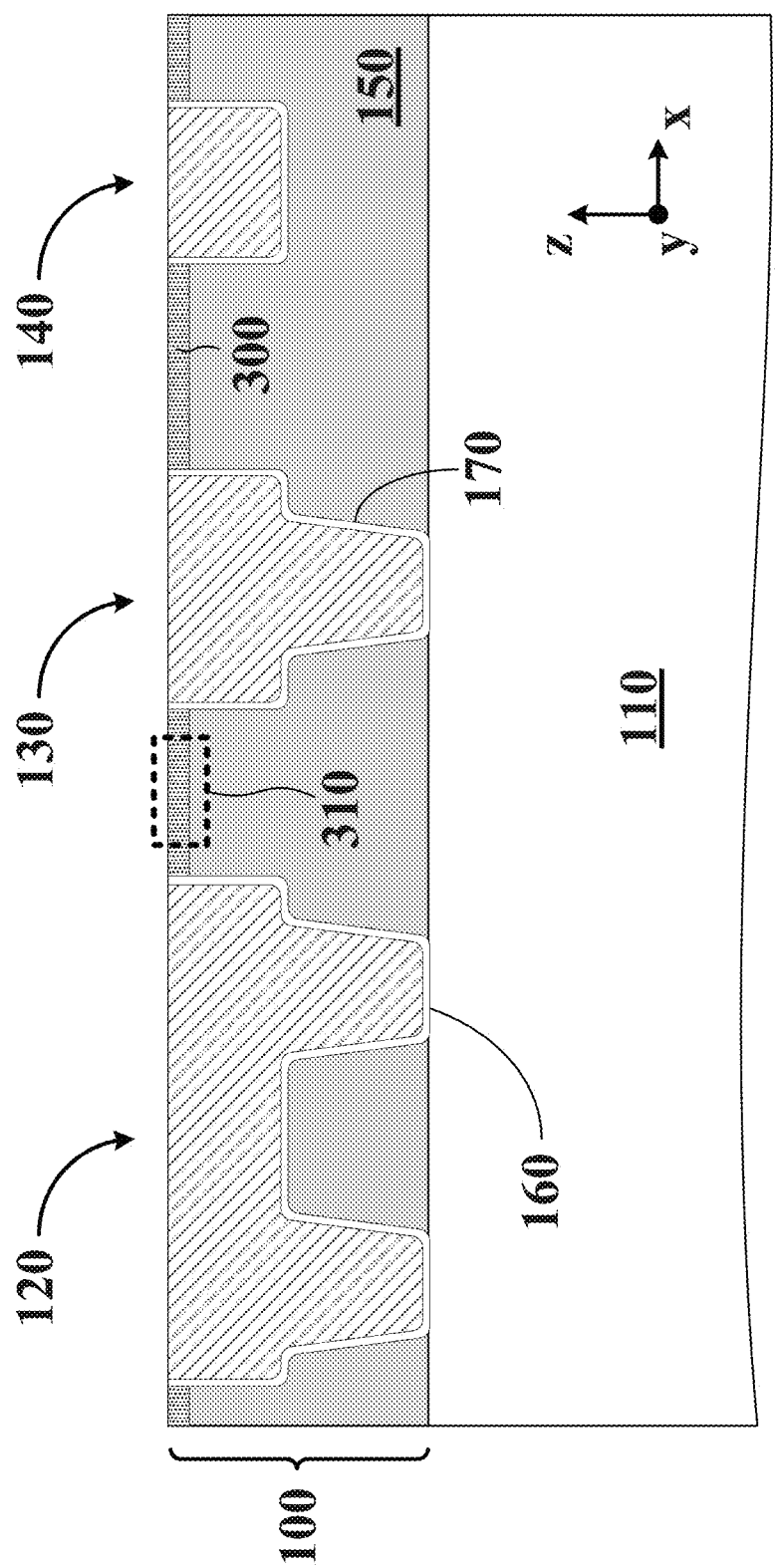
FIG. 3 is a cross-sectional view of a metallization layer after the formation of a nitrogen-rich protective layer on a low-k or extreme low-k dielectric layer, in accordance with some embodiments.

FIG. 3 shows the structure of FIG. 1 after the formation of a nitrogen-rich protective layer 300 within low-k or ELK 150 layer according to operation 210 of method 200. In some embodiments, nitrogen-rich protective layer 300 is selectively formed within low-k or ELK 150 layer for example, there is no formation of a nitride layer on exposed surfaces of conductive structures 120, 130, and 140 of metallization layer 100.

In some embodiments, a process pressure above about 4.5 Torr produces a protective layer with thickness less than about 7 nm, which cannot protect low-k or ELK 150 layer during subsequent processing operations. This is because at process pressures greater than about 4.5 Torr, the mean free path of the nitrogen-based plasma ions (e.g., the distance ions can travel without colliding to each other) reduces. With the number of ion-to-ion collisions increasing, the reaction rate between the ions and low-k or ELK 150 layer reduces. This "low-reaction rate" condition increases the processing time—for example, additional time is required to form the nitrogen-rich protective layer within a thickness range between about 7 nm and about 15 nm.

As discussed above, a nitrogen-rich protective layer with a thickness less than about 7 nm is unable to protect low-k or ELK 150 layer from subsequent processing operations. Conversely, a nitrogen-rich protective layer with a thickness greater than about 15 nm requires additional processing time, increases the fabrication cost, and increases the dielectric constant of low-k or ELK 150 layer.

In some embodiments, a top portion of low-k or ELK 150 layer interacts with the nitrogen-based plasma to produce nitrogen-rich protective layer 300. Consequently, nitrogen-rich protective layer 300 is formed within the top portion of low-k or ELK 150 layer as opposed to being deposited on a top surface of low-k or ELK 150 layer. In some embodiments, the top portion of low-k or ELK 150 layer is converted to nitrogen-rich protective layer 300.

Figure 4A:
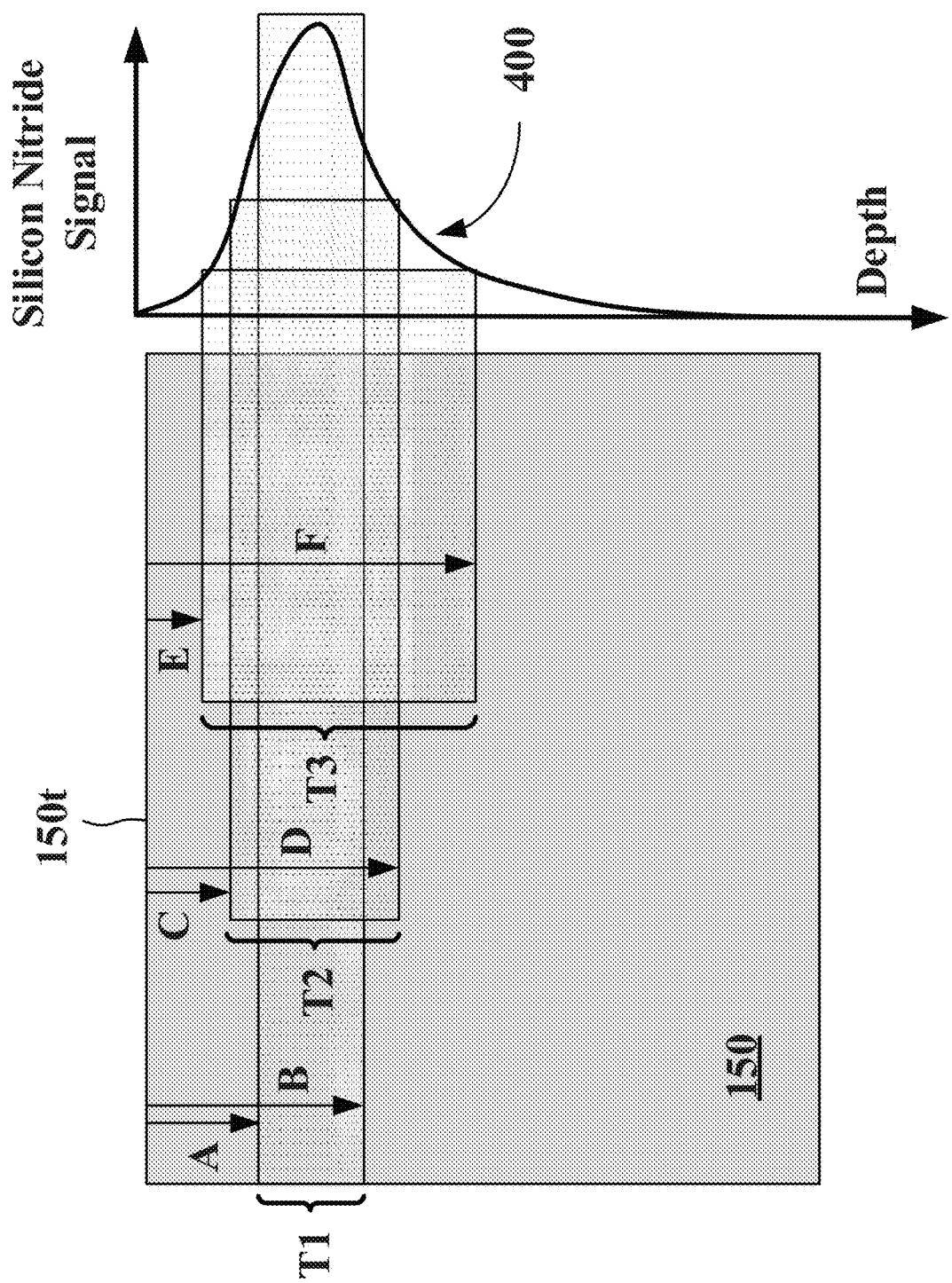
FIGS. 4A and 4B are magnified views of a nitrogen rich protective layer formed in a top portion of a low-k or extreme low-k dielectric layer, in accordance with some embodiments.
Figure 4B:
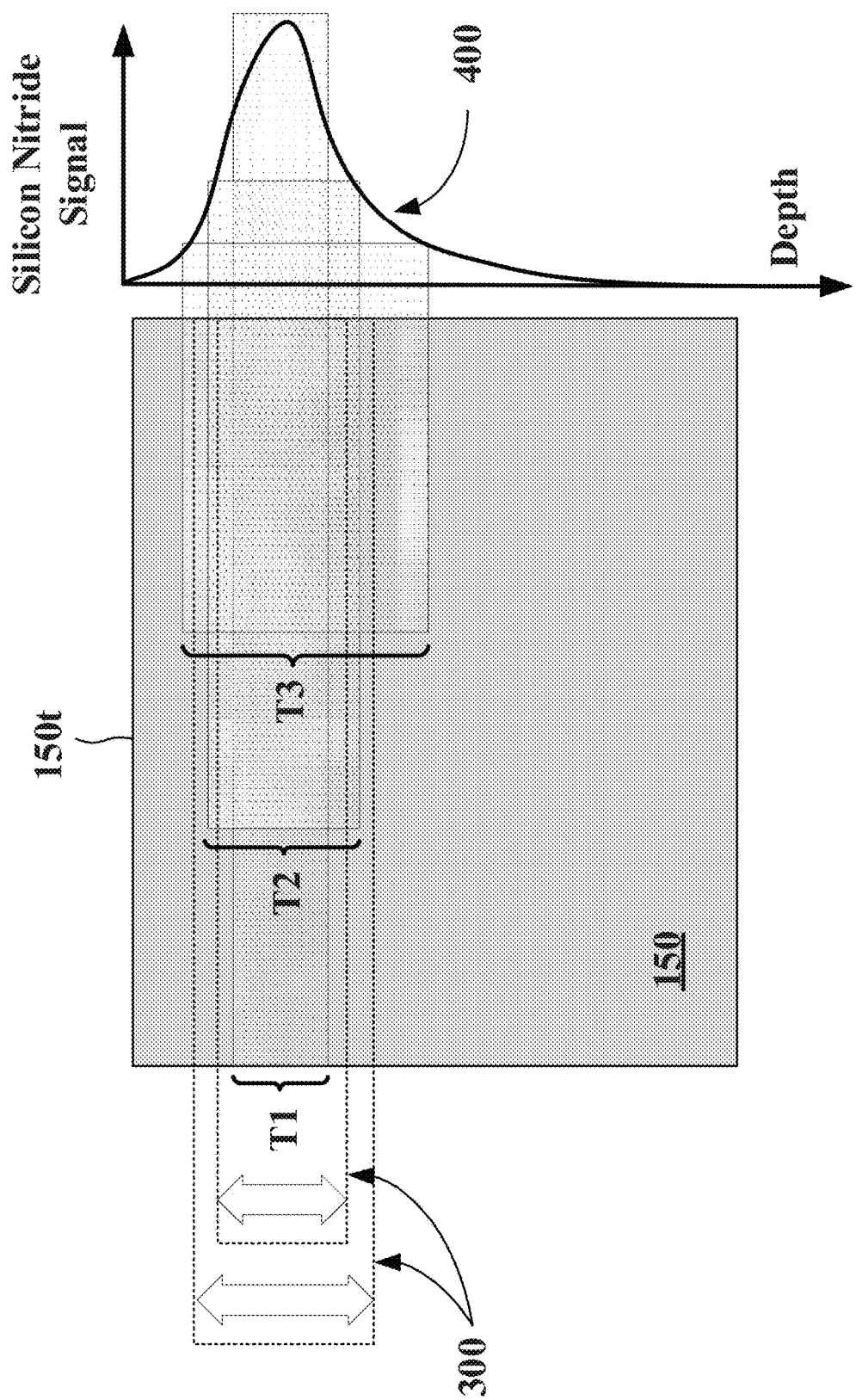

According to some embodiments, FIG. 4A is a magnified view of an area 310 shown in FIG. 3, which includes nitrogen-rich protective layer 300 and a top portion of low-k or ELK 150 layer. In some embodiments, FIG. 4A illustrates a projection of a "silicon nitride signal" represented by a distribution 400 on the top portion of low-k or ELK 150 layer. Distribution 400 is generated by analyzing the top portion of low-k or ELK 150 layer with secondary-ion mass spectrometry (SIMS). Distribution 400 (e.g., the distribution of the silicon nitride signal) is plotted as a function of depth within low-k or ELK 150 layer in reference to top surface 150t. As shown from distribution 400, the silicon nitride signal is not constant as a function of depth. For example, area T1, which extends from a depth A to a depth B, includes the "peak" of the silicon nitride signal represented by distribution 400. Area T2, which extends from a depth C to a depth D, includes about 50% of the silicon nitride signal represented by distribution 400. Further, area T3, which extends from a depth E to a depth F, includes about 30% of the silicon nitride signal represented by distribution 400. In some embodiments, A is about 8 nm, B is about 12 nm, C is about 7 nm, D is about 20 nm, E is about 5 nm, and F is about 25 nm. Therefore, the peak of the silicon nitride signal (e.g., area T1) is located between about 8 nm and about 12 nm from top surface 150t of low-k or ELK 150 layer and has a thickness or width B-A of about 3 nm. Similarly, 50% of the silicon nitride signal (e.g., area T2) is located between about 7 nm and about 20 nm from top surface 150t of low-k or ELK 150 layer and has a thickness or width D-C of about 13 nm. Finally, 30% of the silicon nitride signal (e.g., area T3) is located between about 5 nm and about 25 nm from top surface 150t of low-k or ELK 150 layer and has a thickness or width F-E of about 20 nm. As discussed above, nitrogen-rich protective layer 300 has a thickness between about 7 nm and about 15 nm. Therefore, the thickness of nitrogen-rich protective layer 300 includes area T1, a middle portion of or the entire area T2, and a portion of T3 as shown in FIG. 4B. In some embodiments, and as shown in FIG. 4B, nitrogen-rich protective layer 300 is located within low-k or ELK 150 layer below top surface 150t. As shown in FIG. 4B, silicon nitride signal can be detected outside the "thickness" of nitrogen-rich protective layer 300. In some embodiments, the silicon nitride signal can be detected up to a depth of about 35 nm within low-k or ELK 150 layer.

The silicon nitride signal as represented by distribution 400 in FIGS. 4A and 4B are not limiting and other types of distributions are within the spirit and the scope of this disclosure. For example, normal distributions or skewed distributions with different characteristics are within the spirit and the scope of this disclosure.

In some embodiments, and during the formation of nitrogen-rich protective layer 300, a higher plasma power favors the nitrogen incorporation into nitrogen-rich protective layer 300 compared to a low plasma power. For example, as the plasma power increases above about 500 Watts, the silicon nitride signal (e.g., the peak of distribution 400) increases in height.

In referring to FIG. 2, method 200 continues with operation 220 and the process of depositing a capping layer on conductive structures 120, 130, and 140 embedded in low-k or ELK 150 layer. The capping layer can include a cobalt layer selectively formed on conductive structures 120, 130, and 140. In some embodiments, the capping layer is deposited with a plasma-enhanced chemical vapor deposition (PECVD) process or another suitable deposition method.

In some embodiments, the deposition of the capping layer is a two-step process repeated multiple times (e.g., 2 to 6 times) until the desired thickness of capping layer is achieved. For example, the first step includes a precursor release operation during which conductive structures 120, 130, and 140 are exposed to a cobalt carbonyl precursor—the precursor release operation, top surfaces of metal 160 are covered with precursor molecules. The second process operation includes a precursor dissociation operation during which the nitrogen-based plasma dissociates the precursor molecules to form a film layer. In some embodiments, the capping layer is deposited at a temperature range between about 160° C. and about 260° C. to ensure that the capping layer is selectively deposited on exposed top surfaces of copper metal 160 and not on low-k or ELK 150 layer. For example, deposition temperatures above about 260° C. can encourage the deposition of the capping layer on low-k or ELK 150 layer, while deposition temperatures below about 160° C. suffer from low deposition rates. Low deposition rates increase both the processing time and the fabrication cost. In some embodiments, the process pressure during the precursor dissociation operation can be higher than about 4.5 Torr e.g., higher than the process pressure during the formation of nitrogen-rich protective layer 300 described above.

Figure 5:
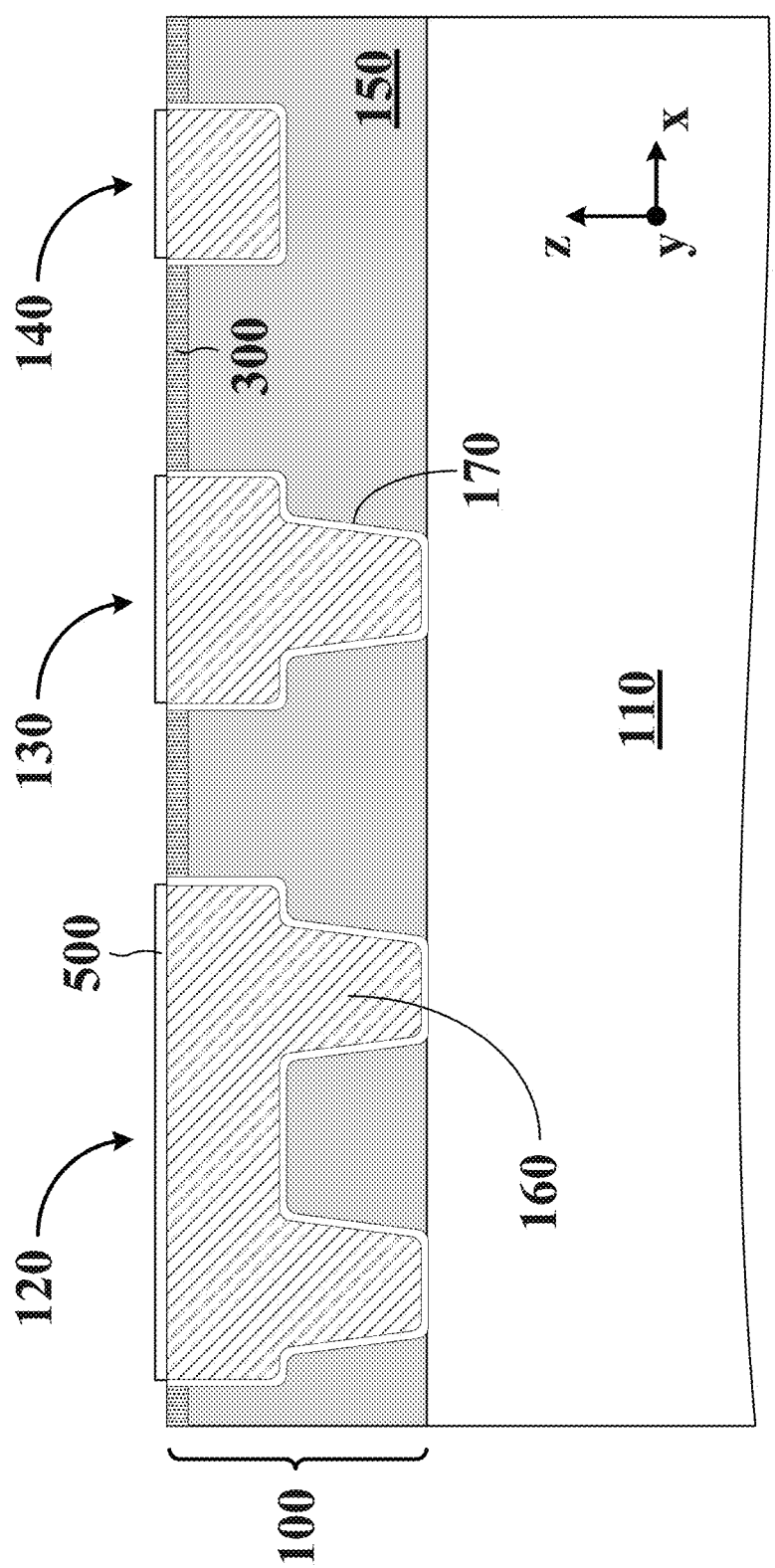
FIG. 5 is a cross-sectional view of a metallization layer after the formation of a capping layer on conductive structures of the metallization layer, in accordance with some embodiments.

In some embodiments, the thickness of the capping layer ranges between about 20 Å and about 40 Å. FIG. 5 shows metallization layer 100 after the selective formation of capping layer 500 on conductive structures 120, 130, and 140 according to operation 220 of method 200 shown in FIG. 2. According to some embodiments, capping layer suppresses copper electromigration from conductive structures 120, 130, and 140 during operation and improves device reliability.

Figure 6:
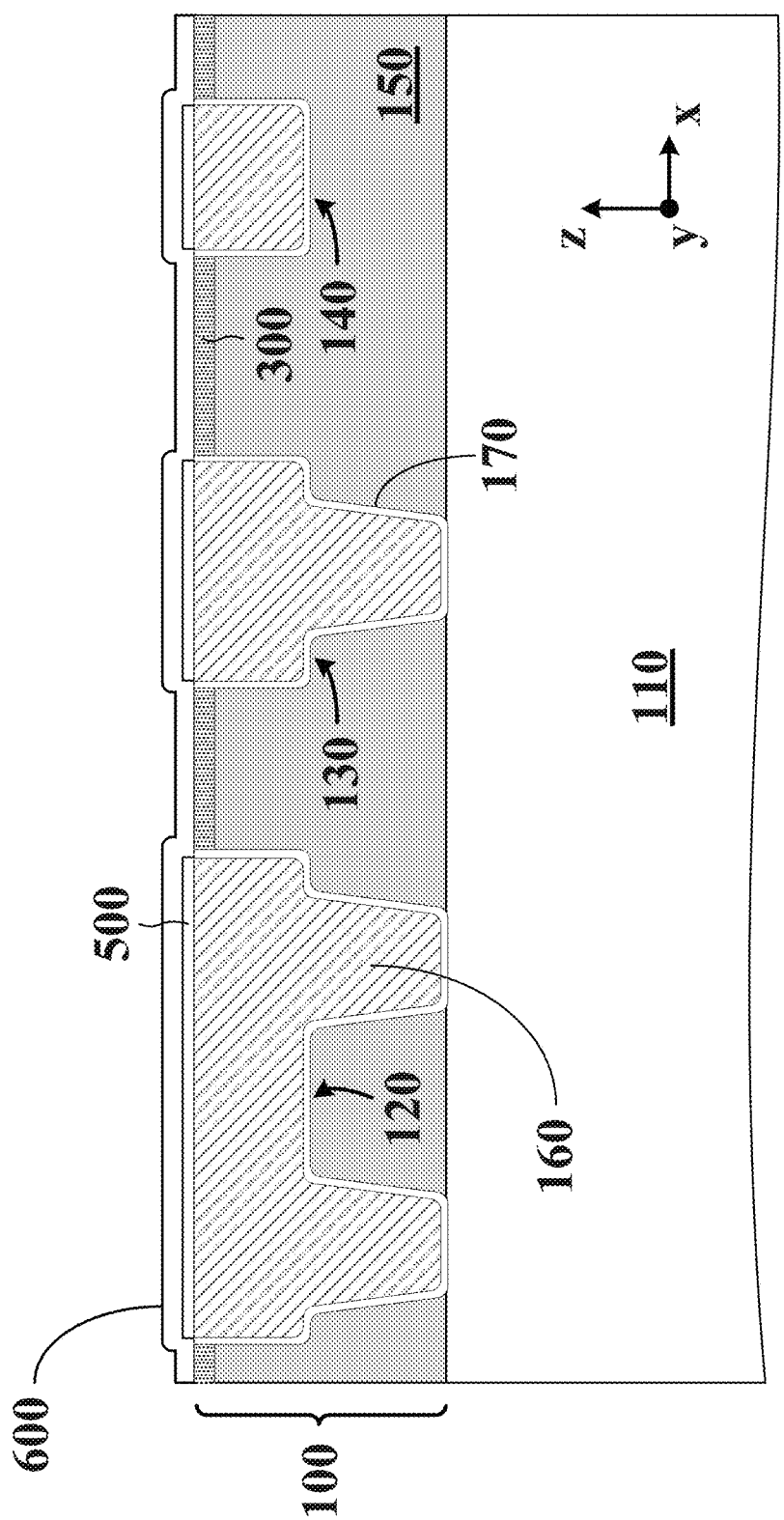
FIG. 6 is a cross sectional view of a metallization layer after the formation of an etch stop layer, in accordance with some embodiments.

In referring to FIG. 2, method 200 continues with operation 230 and the process of forming an etch stop layer on capping layer 500 and nitride-rich layer 300. By way of example and not limitation, the etch stop layer can be blanket deposited (e.g., deposited on all exposed surfaces of metallization layer 100) at a thickness between about 20 Å and about 30 Å with a PECVD process or another suitable process. In some embodiments, the etch stop layer includes a metal nitride layer subsequently exposed to a plasma treatment. In some embodiments, the post-deposition treatment of the etch stop layer removes byproducts generated during the deposition process and densifies the deposited etch stop layer. In some embodiments, the post-deposition treatment damages low-k or ELK 150 layer if nitride-rich layer 300 is not present. According to some embodiments, FIG. 6 shows the structure of FIG. 5 after the formation of etch stop layer 600 according to operation 230.

Figure 7:
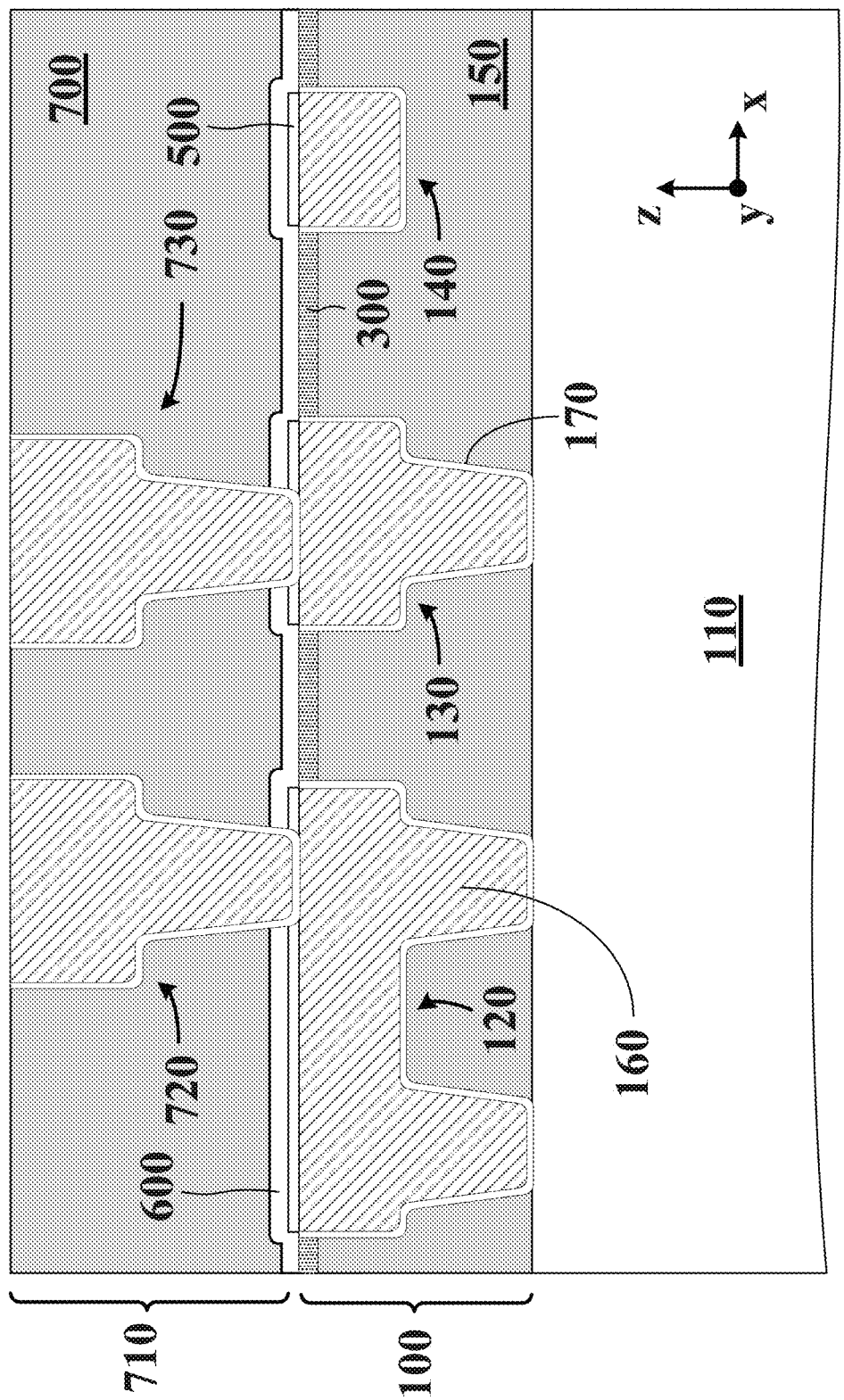
FIG. 7. is a cross-sectional view of two metallization layer, in accordance with some embodiments.

In referring to FIGS. 2 and 7, method 200 continues with operation 240 and the process of depositing another low-k or ELK layer (e.g., low-k or ELK 700 layer) on etch stop layer 600. Low-k or ELK 700 layer can be substantially similar to low-k or ELK 150 layer in terms of dielectric material and thickness. In some embodiments, low-k or ELK 700 layer is part of a metallization layer 710 formed on metallization layer 100. Conductive structures 720 and 730, like conductive structures 120, 130, and 140, can be formed within low-k or ELK 700 layer. Conductive structures 720 and 730 in low-k or ELK 700 layer can be electrically coupled to conductive structures 120, 130, and 140 of metallization layer 100 as shown in FIG. 7. In some embodiments, etch stop layer 600 facilitates the formation of the openings for conductive structures 720 and 730. For example, etch stop layer 600 is used as a stop layer for the etching process during the formation of openings for conductive structures 720 and 730 in low-k or ELK 700 layer.

In some embodiments, method 200 shown in FIG. 2 can be repeated for low-k or ELK 700 layer of metallization layer 710. In some embodiments, method 200 can be performed prior to the formation of a new metallization layer or prior to the formation of an etch stop layer on an existing metallization layer.

In some embodiments, method 200 can be modified to combine operations 210 and 220 into a single operation. For example, in a modified method the capping layer formation process can be adjusted so that nitrogen-rich layer 300 is formed during the capping layer deposition process. For example, the precursor dissociation operation described above with respect to operation 220 can be modified to facilitate the formation of nitrogen-rich protective layer 310 on low-k or ELK 150 layer. This can be achieved, for example, by "modifying" the capping layer deposition process to introduce a "modified" precursor dissociation operation prior to the precursor release operation described above. In some embodiments, the "modified" precursor dissociation operation features an ammonia plasma or a nitrogen plasma at a process pressure between about 1.5 Torr and about 4.5 Torr, followed by a precursor release operation and a precursor dissociation operation performed at a higher pressure (e.g., greater than about 4 Torr). Alternatively, the later precursor dissociation operation performed after the precursor release operation can also be "modified" and performed at a low-pressure between about 1.5 Tour and about 4.5 Torr.

Figure 8:
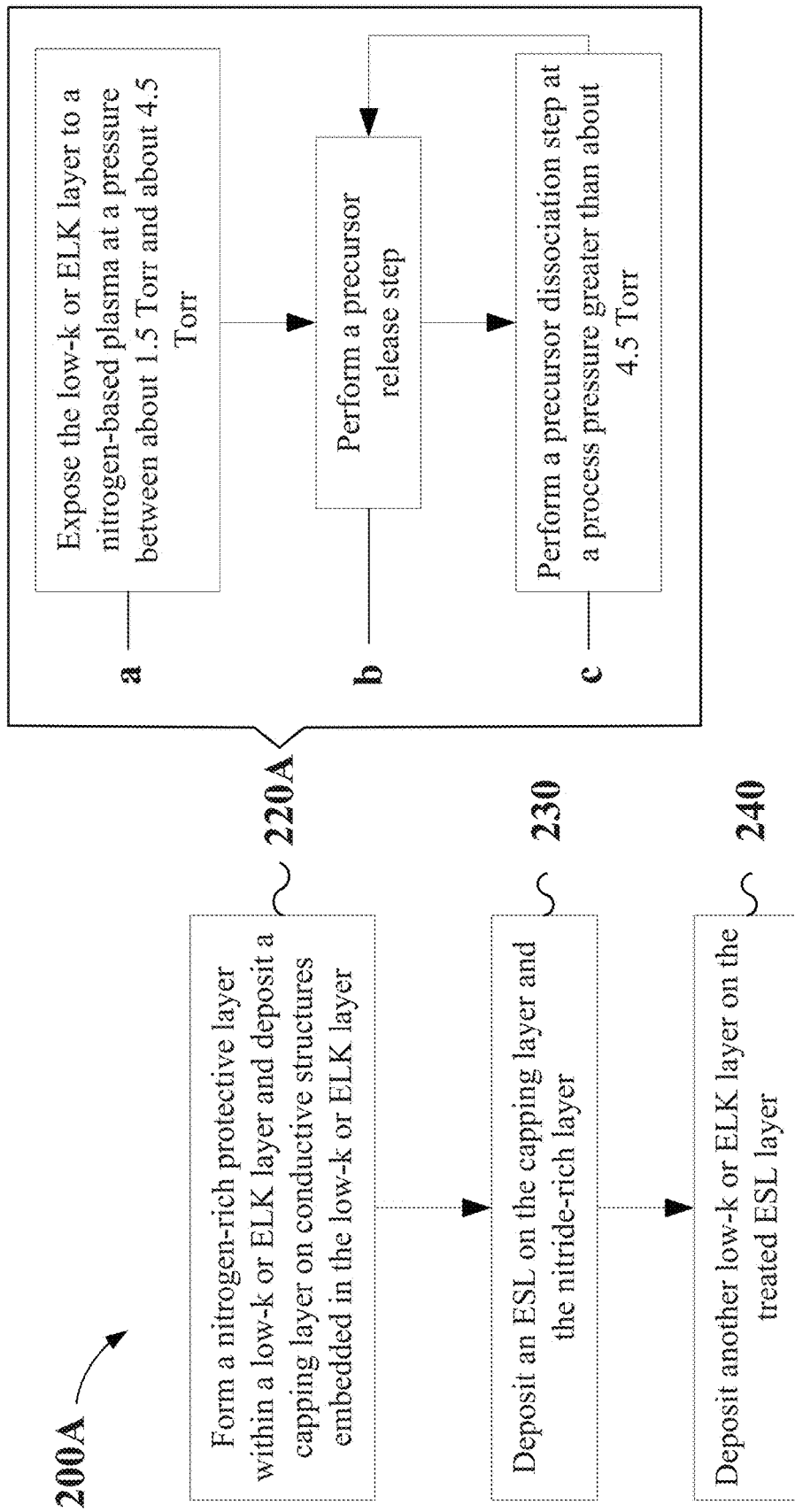
FIGS. 8 and 9 are flowcharts of methods for the formation of a nitrogen-rich protective layer on a low-k or extreme low-k dielectric of a metallization layer, in accordance with some embodiments.

For example, FIG. 8 is a "modified" method 200A, according to the description above. Method 200A begins with a modified operation 220A in which operations 210 and 220 of method 200 have been "merged" into a single operation. More specifically, operation 220A includes sub-operations a, b, and c. Sub-operation a is a modified precursor dissociation step performed at a low-pressure between about 1.5 Torr and about 4.5 Torr (e.g., similar to operation 210 discussed above) with a plasma power between about 350 Watts and about 500 Watts to facilitate the formation of nitrogen-rich layer 300. During sub-operation a, low-k or ELK 150 layer shown in FIG. 1 is exposed to a nitrogen-based plasma to form nitrogen-rich protective layer 300. Sub-operation b of operation 220A, is a precursor release step similar to that of operation 220 of method 200 described above. Finally, sub-operation c is a precursor dissociation step similar to that of operation 220 of method 200 described above. For example, sub-operation c can be performed at a process pressure greater than about 4.5 Torr.

In some embodiments, sub-operations b and c can be repeated as required until the desired thickness of the capping layer is achieved. Method 200A further includes operations 230 and 240 which are similar to the corresponding operations of method 200.

Figure 9:
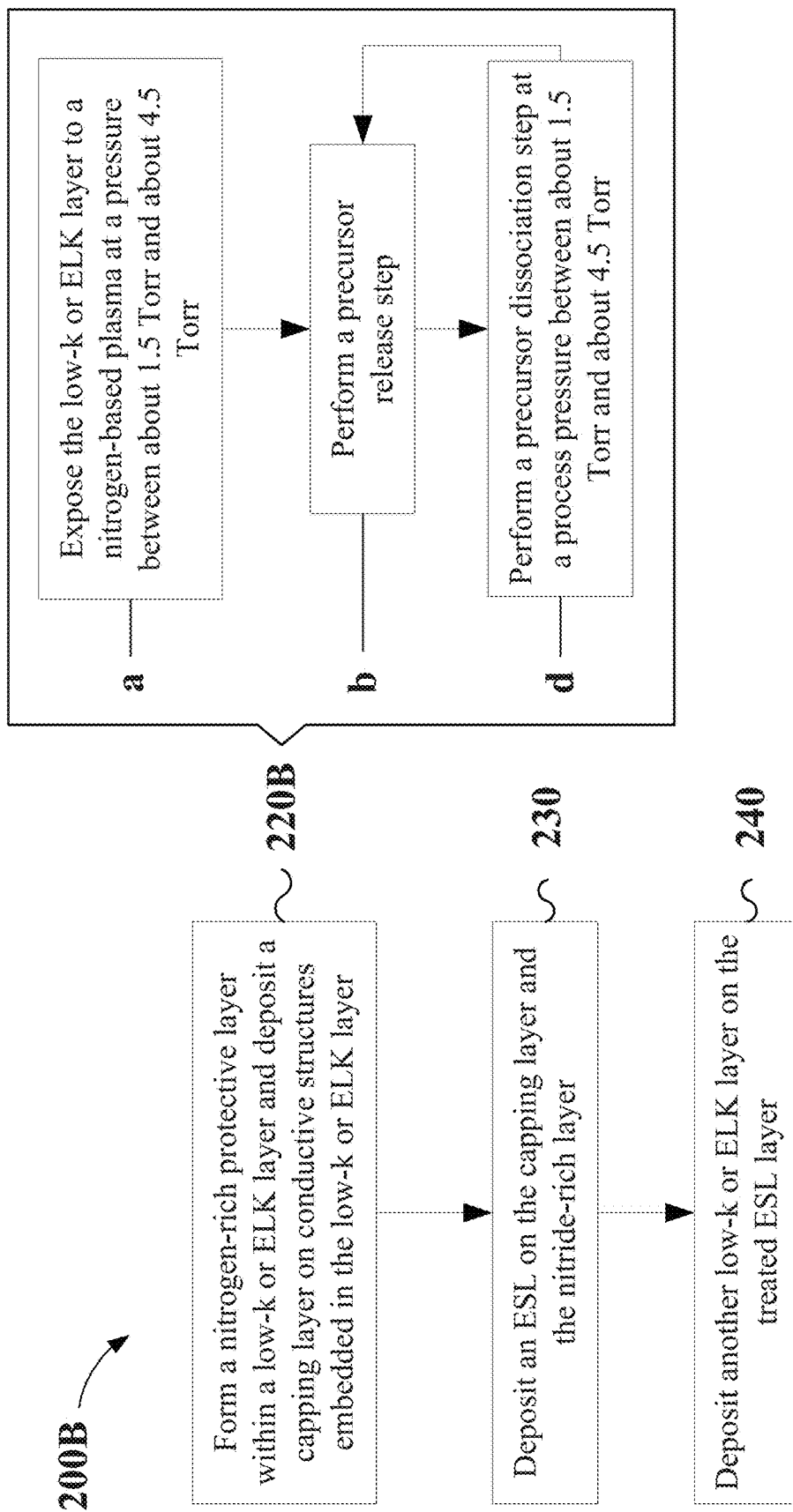

According to some embodiments, FIG. 9 is yet another "modified" method 200B which is a variant of method 200A. In method 200B, operation d is a modified precursor dissociation step performed with a nitrogen-based plasma at a low-pressure between about 1.5 Torr and about 4.5 Torr, and a plasma power between about 350 Watts and about 500 Watts. In some embodiments, sub-operations b and d can be repeated as required until the desired thickness of the capping layer is achieved. Method 200B, like method 200A, further includes operations 230 and 240 which are similar to the corresponding operations of method 200.

Various embodiments in accordance with this disclosure describe a method for the fabrication of a capping layer within the low-k or ELK layer to prevent damage from subsequent processing operations, such as the ones included in the formation of etch stop layers. In some embodiments, the protective layer is formed by exposing top surfaces of low-k or ELK layers to a nitrogen-based plasma treatment process that includes a process pressure between about 1.5 Torr and about 4.5 Torr and a plasma power between about 450 Watts and about 500 Watts. In some embodiments, the nitrogen-based plasma process includes ammonia or nitrogen. In some embodiments, the protective layer is formed prior to the formation of a capping layer on conductive structures of the metallization layer and prior to the formation of the etch stop layer. In other embodiments, the protective layer is formed during the formation of the capping layer on the conductive structures of the metallization layer and prior to the formation of the etch stop layer. In some embodiments, the low-k or ELK protective layer is a nitrogen-rich layer formed within the top portion of the low-k or ELK layer at a thickness between about 7 nm and about 15 nm and is located at a depth between about 3 nm and about 6 nm from a top surface of the low-k or ELK layer.

In some embodiments, a structure includes a substrate with a first metallization layer, where the first metallization layer includes first conductive structures embedded in a dielectric. The structure further includes: (i) a nitrogen-rich layer formed within the dielectric and between the first conductive structures, (ii) an etch stop layer on the first metallization layer and in contact with portions of the first conductive structures and with the nitrogen-rich layer, and (iii) a second metallization layer on the first metallization layer that includes second conductive structures in contact with other portions of the first conductive structures not in contact with the etch stop layer.

In some embodiments, a method includes forming, on a substrate, a metallization layer with conductive structures embedded in a low-k dielectric; exposing the metallization layer to a nitrogen-based plasma to form a nitrogen-rich protective layer within the low-k dielectric; forming a capping layer on the conductive structures; and forming an etch stop layer on the capping layer and the low-k dielectric.

In some embodiments, a method includes forming, on a substrate, a metallization layer having conductive structures in a low-k dielectric. The method further includes forming a capping layer on the conductive structures, where forming the capping layer includes exposing the metallization layer to a first plasma process to form a nitrogen-rich protective layer within the low-k dielectric, releasing a precursor on the metallization layer to cover top surfaces of the conductive structures with precursor molecules, and treating the precursor molecules with a second plasma process to dissociate the precursor molecules and form the capping layer. Additionally the method includes forming an etch stop layer to cover the capping layer and top surfaces of the low-k dielectric.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
forming a conductive structure embedded in a low-k dielectric layer;
exposing the low-k dielectric layer to a first nitrogen-only plasma, prior to forming a capping layer on the conductive structure;
forming a nitrogen-rich protective layer within the low-k dielectric layer, in response to a first process pressure of the first nitrogen-only plasma being between 1.5 Torr and 4.5 Torr;
depositing a capping layer precursor on the conductive structure;
dissociating the capping layer precursor with a second nitrogen-based plasma to form the capping layer;
depositing an etch stop layer on the capping layer and the nitrogen-rich protective layer; and
performing a post-deposition treatment on the etch stop layer, wherein the nitrogen-rich protective layer protects the low-k dielectric layer from the post-deposition treatment.

2. The method of claim 1, wherein exposing the low-k dielectric layer to the first nitrogen-only plasma having a plasma power between about 350 Watts and about 500 Watts.

3. The method of claim 1, wherein exposing the low-k dielectric layer to the first nitrogen-only plasma comprises forming the nitrogen-rich protective layer with a thickness between about 7 nm and about 15 nm.

4. The method of claim 1, wherein exposing the low-k dielectric layer to the first nitrogen-only plasma comprises forming the nitrogen-rich protective layer within the low-k dielectric layer and at a distance below a top surface of the low-k dielectric layer.

5. The method of claim 1, wherein exposing the low-k dielectric layer to the first nitrogen-only plasma comprises converting a top portion of the low-k dielectric layer to form the nitrogen-rich protective layer.

6. The method of claim 1, further comprising:
forming an other low-k dielectric layer on the etch stop layer; and
forming an other conductive structure within the other low-k dielectric layer, wherein the other conductive structure is in contact with the conductive structure through the etch stop layer and the capping layer.

7. The method of claim 1, wherein depositing the capping layer precursor comprises exposing the conductive structure to a cobalt carbonyl precursor.

8. The method of claim 1, wherein dissociating the capping layer precursor with the second nitrogen-based plasma comprises treating the capping layer precursor with an ammonia plasma or a nitrogen plasma at a process pressure greater than 1.5 Torr.

9. The method of claim 1, further comprising repeating depositing the capping layer precursor and dissociating the capping layer precursor 2 to 6 times.

10. The method of claim 1, further comprising forming a nitrogen-rich layer less than about 7 nm in thickness in response to a second process pressure of the first nitrogen-only plasma being greater than 4.5 Torr.

11. A method, comprising:
forming conductive structures within a dielectric layer;
depositing a capping layer on the conductive structures using plasma-enhanced chemical vapor deposition;
selectively forming a nitrogen-rich protective layer, prior to depositing the capping layer on the conductive structures, using a nitrogen-only plasma with a first process pressure being between 1.5 Torr and 4.5 Torr, wherein the nitrogen-rich protective layer has a nitrogen concentration profile between adjacent conductive structures, within the dielectric layer, and at a distance below a top surface of the dielectric layer;
forming an etch stop layer on the capping layer and the dielectric layer; and
performing a plasma treatment on the etch stop layer, wherein the nitrogen-rich protective layer protects the dielectric layer from the plasma treatment.

12. The method of claim 11, wherein selectively forming the nitrogen-rich protective layer with the nitrogen concentration profile comprises:
forming a first portion of a silicon nitride, wherein the first portion has a peak nitrogen concentration in atomic percentage higher than a second portion and a third portion of the silicon nitride, and wherein the first portion is located between about 8 nm and about 12 nm below the top surface of the dielectric layer;
forming the second portion of the silicon nitride with 50% of the peak nitrogen concentration, wherein the second portion is located between about 7 nm and about 8 nm and between about 12 nm and about 20 nm below the top surface of the dielectric layer; and
forming the third portion of the silicon nitride with 30% of the peak nitrogen concentration, wherein the third portion is located between about 5 nm and about 7 nm and between about 20 nm and about 25 nm below the top surface of the dielectric layer.

13. The method of claim 11, wherein selectively forming the nitrogen-rich protective layer comprises converting a top portion of the dielectric layer to form the nitrogen-rich protective layer.

14. The method of claim 11, wherein selectively forming the nitrogen-rich protective layer with the nitrogen concentration profile comprises treating the dielectric layer with an ammonia plasma or a nitrogen-only plasma.

15. The method of claim 11, wherein selectively forming the nitrogen-rich protective layer with the nitrogen concentration profile comprises treating the dielectric layer with the nitrogen-only plasma having a plasma power between about 350 Watts and about 500 Watts.

16. The method of claim 11, wherein exposing the dielectric layer to the first nitrogen-only plasma comprises forming the nitrogen-rich protective layer at a depth between about 3 nm and about 6 nm below the top surface of the dielectric layer.

17. The method of claim 11, further comprising selectively forming a nitrogen-rich layer less than about 7 nm in thickness, prior to depositing the capping layer on the conductive structures, in response to a nitrogen-only plasma with a second process pressure being greater than 4.5 Torr.

18. A method, comprising:
 forming first conductive structures within a first dielectric layer;
 forming a nitrogen-rich protective layer between adjacent first conductive structures and within the first dielectric layer, prior to forming a capping layer on the first conductive structures,
  wherein the nitrogen-rich protective layer is formed using a first nitrogen-only plasma with a process pressure between 1.5 Torr and 4.5 Torr;
 covering the first conductive structures with a capping layer precursor;
 dissociating the capping layer precursor with a second nitrogen-based plasma to form the capping layer;
 depositing a metal nitride based etch stop layer on the capping layer and the first dielectric layer;
 performing a post-deposition treatment on the metal nitride based etch stop layer,
  wherein the nitrogen-rich protective layer protects the first dielectric layer from the post-deposition treatment, and
  wherein the post-deposition treatment on the metal nitride based etch stop layer removes byproducts generated during the deposition of the etch stop layer and densifies the metal nitride based etch stop layer; and
 forming second conductive structures within a second dielectric layer formed on the metal nitride based etch stop layer, wherein the second conductive structures are in contact with the first conductive structures through the metal nitride based etch stop layer and the capping layer.

19. The method of claim 18, wherein forming the nitrogen-rich protective layer comprises forming a nitrogen concentration profile at a distance below a top surface of the first dielectric layer.

20. The method of claim 18, wherein the first nitrogen-only plasma comprises a process pressure lower than that of the second nitrogen-based plasma.

* * * * *

UNITED STATES PATENT AND TRADEMARK OFFICE
CERTIFICATE OF CORRECTION

PATENT NO. : 11,699,618 B2
APPLICATION NO. : 16/991665
DATED : July 11, 2023
INVENTOR(S) : Lee et al.

It is certified that error appears in the above-identified patent and that said Letters Patent is hereby corrected as shown below:

In the Claims

In Column 10, Claim 14, Lines 64-65, after "with" delete "an ammonia plasma or".

Signed and Sealed this
Twelfth Day of March, 2024

Katherine Kelly Vidal
*Director of the United States Patent and Trademark Office*